United States Patent
Tummapalli et al.

(10) Patent No.: US 11,598,475 B2
(45) Date of Patent: Mar. 7, 2023

(54) CALIPER PIG FOR DETECTING GEOMETRICAL DEFORMATION OF A PIPELINE

(71) Applicant: Indian Oil Corporation Limited, Mumbai (IN)

(72) Inventors: Sai Kiran Tummapalli, Haryana (IN); Pradeep Kumar Sharma, Haryana (IN); Dhirendra Pratap, Haryana (IN); Purushottam Kashinath Nimje, Haryana (IN); Mohammad Amir Qasi, Haryana (IN); Kannan Chandrasekaran, Haryana (IN); Sanjiv Kumar Mazumdar, Haryana (IN); Sankara Sri Venkata Ramakumar, Haryana (IN)

(73) Assignee: Indian Oil Corporation Limited, Mumbai (IN)

( * ) Notice: Subject to any disclaimer, the term of this patent is extended or adjusted under 35 U.S.C. 154(b) by 99 days.

(21) Appl. No.: 17/237,472

(22) Filed: Apr. 22, 2021

(65) Prior Publication Data
US 2021/0332930 A1 Oct. 28, 2021

(30) Foreign Application Priority Data

Apr. 22, 2020 (IN) .............................. 202021017335

(51) Int. Cl.
*F16L 55/26* (2006.01)
*F16L 55/44* (2006.01)
(Continued)

(52) U.S. Cl.
CPC ............... *F16L 55/44* (2013.01); *F16L 55/48* (2013.01); *F16L 2101/30* (2013.01)

(58) Field of Classification Search
CPC .............................. F16L 55/44; F16L 2101/30
See application file for complete search history.

(56) References Cited

U.S. PATENT DOCUMENTS

| 6,879,240 B2 | 4/2005 | Kruse |
| 7,570,047 B2 | 8/2009 | Stuve et al. |
| (Continued) | | |

FOREIGN PATENT DOCUMENTS

| KR | 100655559 B1 | 12/2006 |
| KR | 20190081095 A | 7/2019 |
| (Continued) | | |

OTHER PUBLICATIONS

KR-100655559-B1 English Translation Dec. 8, 2006.*
European Search Report for EP21169549.9 dated Aug. 19, 2021, 10 pgs.

*Primary Examiner* — Minh Q Phan
(74) *Attorney, Agent, or Firm* — Blank Rome LLP

(57) ABSTRACT

A caliper pig for detecting geometrical deformation of a pipeline is disclosed. The caliper pig includes a body and a first sensor arm assembly. The first sensor arm assembly includes a primary caliper sensor ring adapted to be mounted on the body. Further, the first sensor arm assembly includes a plurality of sensor arms adapted circumferentially distributed on the primary caliper sensor ring. Each of the plurality of sensor arms includes a sensing arm adapted to be in contact with an internal surface of the pipeline and a pair of magnets adapted to rotate along the sensing arm. Each of the plurality of sensor arms includes a sensing unit configured to detect a change in magnetic field based on the movement of the sensing arm. The sensing unit is configured to generate an output indicative of an angle of deflection of the sensing arm while traversing on the internal surface of the pipeline.

10 Claims, 8 Drawing Sheets

(51) Int. Cl.
   *F16L 55/48*   (2006.01)
   *F16L 101/30*  (2006.01)

(56) References Cited

U.S. PATENT DOCUMENTS

| | | |
|---|---|---|
| 2006/0248966 A1 | 11/2006 | Houldey et al. |
| 2010/0060267 A1* | 3/2010 | Wagner .................. G01D 5/145 |
| | | 324/207.2 |
| 2011/0095752 A1 | 4/2011 | Short et al. |
| 2011/0167914 A1 | 7/2011 | Sutherland |

FOREIGN PATENT DOCUMENTS

| | | |
|---|---|---|
| WO | 2009001022 A1 | 12/2008 |
| WO | WO-2009/002368 A2 | 12/2008 |

\* cited by examiner

CALIPER PIG FOR DETECTING GEOMETRICAL DEFORMATION OF A PIPELINE

RELATED APPLICATION

This application claims the benefit of Indian Application No. 202021017335, filed on Apr. 22, 2020. The entire disclosure of this application is hereby incorporated by reference.

FIELD OF THE INVENTION

The present disclosure relates caliper pigs for pipeline measurement and more particularly, to a caliper pig with a sensor arm assembly for detecting geometrical deformation of a pipeline.

BACKGROUND

Inspection of buried cross-country pipelines is carried out by running Intelligent PIGS (IPIG) through a pipeline. The pipelines are subject to structural damages frequently during operation & maintenance and may develop physical deformations like ovalities and dents besides the corrosion on the external and internal surfaces of the pipeline. The geometrical deformations may also be a potential threat to the integrity of the pipeline structure. Caliper Pigs are run through the pipeline to identify these geometrical deformations. Moreover, it is a common practice to carry out caliper pigging before running Intelligent Pigs to ensure a clear pipe bore for safe passage of IPIG. Caliper pigging & Intelligent pigging are mandatory inspections to be carried out at periodicity defined by statutory authorities of the state. The information about geometrical deformation helps the pipeline owner to take corrective actions to maintain the integrity of the pipeline.

India, being a vast country, the pipeline infrastructure is a necessity for the transport of crude oil and petroleum products over long distances. Pipelines are energy efficient, safe, and environment-friendly modes of transport of fossil fuels. Pigging helps maintain the integrity of pipelines by monitoring their metal loss, geometry, and structural defects. An accurate and reliable Caliper pigging tool will be a great help in maintaining the integrity of the transmission pipelines used for transportation for oil and gas over large distances.

U.S. Pat. No. 7,570,047B2 discloses the magnetic rotational position sensor that employs a single magnet mounted on a rotating turret that rotates on a housing that is fixedly mounted about a fixed ball stud. The turret is arranged to rotate around the hall stud in a first plane. A magnetic field orientation sensor is mounted to the housing, such that the magnet rotates along an arc tangent to the Hall effect sensor. The ball of the ball stud forms one half of a universal joint, the other half being formed by a shall termination that is mounted to rotate with the turret, and also mounted for rotation in a second plane perpendicular to the first plane of the turret.

U.S. Pat. No. 6,879,240B2 relates to the Ball joint with an integrated angle sensor—a permanent magnet is arranged on the ball as the field transducer. In the area of the housing directly opposite the magnet in the un-ejected state of the ball pivot, a magneto-resistive sensor is arranged such that this sensor interacts with the magnetic field produced by the permanent magnet. A rotation of the un-ejected ball pivot around its longitudinal axis can be detected by means of the magneto-resistive sensor, in which case the angle detected can be used.

WO2009002368 discloses the magnetic rotational position sensor employs a single diametrically magnetized magnet mounted on a rotating turret that rotates about a single axis on housing. The housing is mounted about a fixed ball stud and the turret is arranged to rotate about the single ball stud in a plane. A magnetic field orientation type Hall effect sensor is mounted to the housing, such that the magnet rotates about 45 degrees on either side of the sensor along the arctangent to the sensor.

Development of the Caliper System for a Geometry PIG Based on Magnetic Field Analysis covers the developed caliper system consists of a finger arm, an anisotropic permanent magnet, a back yoke, pins, pinholes, and a linear hall effect sensor. The angle displacement of the finger arm is measured by the change of the magnetic field in sensing module. Therefore, the sensitivity of the caliper system mainly depends on the magnitude of the magnetic field inside the sensing module. In this research, the ring-shaped anisotropic permanent magnet and linear hall effect sensors were used to produce and measure the magnetic field.

SUMMARY

This summary is provided to introduce a selection of concepts, in a simplified format, that are further described in the detailed description of the invention. This summary is neither intended to identify key or essential inventive concepts of the invention and nor is it intended for determining the scope of the invention.

The present disclosure relates to the Caliper/geometry pigs which are used to detect deformations such as dents, ovalities, bend radius & angle, etc. in a buried cross-country pipeline or process pipelines through inline inspection. The information related to the deformations helps a pipeline operator or a service provider to take corrective action to maintain the integrity of the pipeline. The design of the caliper pig is based on the measurement of angle of deflection of the sensor arm. The proposed caliper pig provides a high resolution and low power sensor system with high-frequency response meeting the requirements of the speed of travel of the caliper pig in a pipeline.

In an embodiment of the present disclosure, a caliper pig for detecting geometrical deformation of a pipeline is disclosed. The caliper pia includes a body and a first sensor arm assembly. The first sensor arm assembly includes a primary caliper sensor ring adapted to be mounted on the body. Further, the first sensor arm assembly includes a plurality of sensor arms adapted to be mounted and circumferentially distributed on the primary caliper sensor ring. Each of the plurality of sensor arms includes a sensing arm adapted to be in contact with an internal surface of the pipeline. The sensing arm is adapted to resiliently move based on contour of the internal surface of the pipeline. Each of the plurality of sensor arms includes a magnet coaxially disposed in the sensing arm and adapted to rotate along the sensing arm. Further, each of the plurality of sensor arms includes a sensing unit. The sensing unit is configured to detect a change in magnetic field associated with the magnet based on the movement of the sensing arm. The sensing unit is configured to generate an output indicative of an angle of deflection of the sensing arm while traversing on the internal surface of the pipeline.

In another embodiment of the present disclosure, a sensor arm assembly for a caliper pig to detect geometrical deformation of a pipeline is disclosed. The sensor arm assembly includes a primary caliper sensor ring adapted to be mounted on a body of the caliper pig. The sensor arm assembly includes a plurality of sensor arms adapted to be mounted and circumferentially distributed on the primary caliper sensor ring. Each of the plurality of sensor arms includes a sensing arm adapted to be in contact with an internal surface of the pipeline. The sensing arm is adapted to resiliently move based on contour of the internal surface of the pipeline. Each of the plurality of sensor arm includes a magnet coaxially disposed in the sensing arm and adapted to rotate along the sensing arm. Further, each of the plurality of sensor arm includes a sensing unit configured to detect a change in magnetic field associated with the magnet based on the movement of the sensing arm. The sensing unit is configured to generate an output indicative of an angle of deflection of the sensing arm while traversing on the internal surface of the pipeline.

To further clarify advantages and features of the present invention, a more particular description of the invention will be rendered by reference to specific embodiments thereof, which is illustrated in the appended drawings. It is appreciated that these drawings depict only typical embodiments of the invention and are therefore not to be considered limiting of its scope. The invention will be described and explained with additional specificity and detail with the accompanying drawings.

BRIEF DESCRIPTION OF THE DRAWINGS

These and other features, aspects, and advantages of the present invention will become better understood when the following detailed description is read with reference to the accompanying drawings in which like characters represent like parts throughout the drawings, wherein.

Figure 1A:
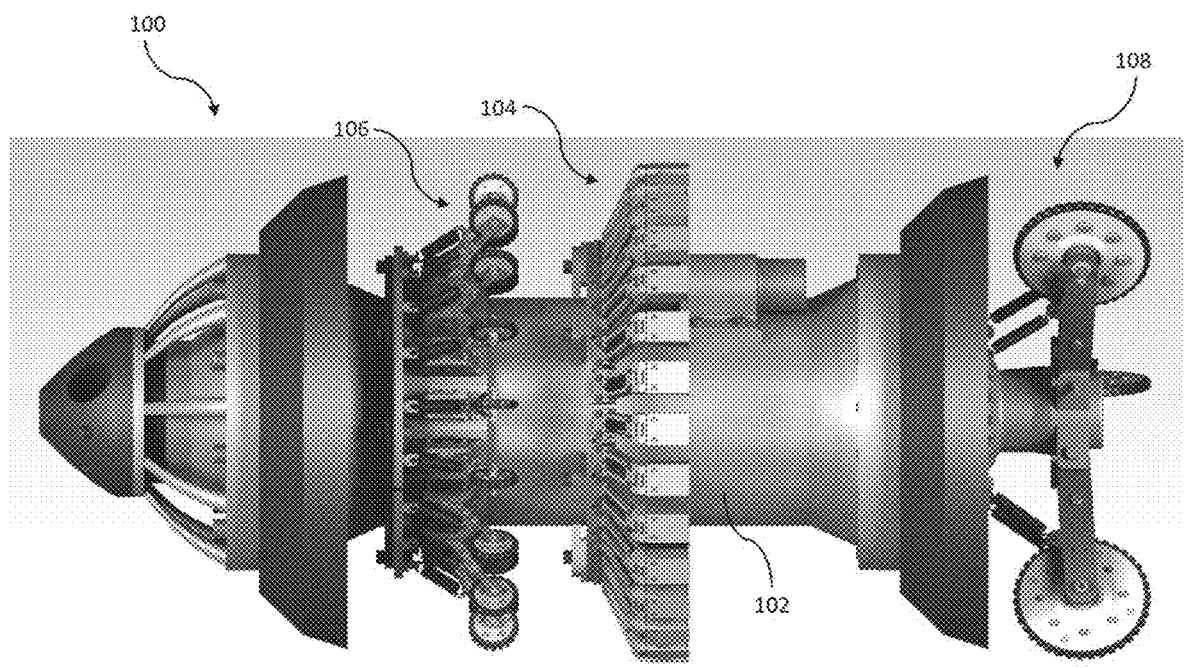
FIG. 1a illustrates a planar view of a caliper pig for detecting geometrical deformation of a pipeline, according to an embodiment of the present disclosure.

Further, skilled artisans will appreciate that elements in the drawings are illustrated for simplicity and may not have been necessarily been drawn to scale. For example, the flow charts illustrate the method in terms of the most prominent steps involved to help to improve understanding of aspects of the present invention. Furthermore, in terms of the construction of the device, one or more components of the device may have been represented in the drawings by conventional symbols, and the drawings may show only those specific details that are pertinent to understanding the embodiments of the present invention so as not to obscure the drawings with details that will be readily apparent to those of ordinary skill in the art having benefit of the description herein.

DETAILED DESCRIPTION OF FIGURES

For the purpose of promoting an understanding of the principles of the invention, reference will now be made to the embodiment illustrated in the drawings and specific language will be used to describe the same. It will nevertheless be understood that no limitation of the scope of the invention is thereby intended, such alterations and further modifications in the illustrated system, and such further applications of the principles of the invention as illustrated therein being contemplated as would normally occur to one skilled in the art to which the invention relates. Unless otherwise defined, all technical and scientific terms used herein have the same meaning as commonly understood by one of ordinary skilled in the art to which this invention belongs. The system, methods, and examples provided herein are illustrative only and not intended to be limiting.

The term "some" as used herein is defined as "none, or one, or more than one, or all." Accordingly, the terms "none," "one," "more than one," "more than one, but not all" or "all" would all fall under the definition of "some." The term "some embodiments" max refer to no embodiments or to one embodiment or to several embodiments or to all embodiments. Accordingly, the term "some embodiments" is defined as meaning "no embodiment, or one embodiment, or more than one embodiment, or all embodiments."

The terminology and structure employed herein is for describing, teaching and illuminating some embodiments and their specific features and elements and does not limit, restrict or reduce the spirit and scope of the claims or their equivalents.

More specifically, any terms used herein such as but not limited to "includes," "comprises," "has," "consists," and grammatical variants thereof do NOT specify an exact limitation or restriction and certainly do NOT exclude the possible addition of one or more features or elements, unless otherwise stated, and furthermore must NOT be taken to exclude the possible removal of one or more of the listed features and elements, unless otherwise stated with the limiting language "MUST comprise" or "NEEDS TO include."

Whether or not a certain feature or element was limited to being used only once, either way it may still be referred to as "one or more features" or "one or more elements" or "at least one feature" or "at least one element," Furthermore, the use of the terms "one or more" or "at least one" feature or element do NOT preclude there being none of that feature or element, unless otherwise specified by limiting language such as "there NEEDS to be one or more. " or "one or more element is REQUIRED."

Unless otherwise defined, all terms, and especially any technical and/or scientific terms, used herein may be taken to have the same meaning as commonly understood by one having an ordinary skill in the art.

Reference is made herein to some "embodiments." It should be understood that an embodiment is an example of a possible implementation of any features and/or elements presented in the attached claims. Some embodiments have been described for the purpose of illuminating one or more of the potential ways in which the specific features and/or elements of the attached claims fulfil the requirements of uniqueness, utility and non-obviousness.

Use of the phrases and/or terms such as but not limited to "a first embodiment," "a further embodiment," "an alternate embodiment," "one embodiment," "an embodiment," "multiple embodiments," "some embodiments," "other embodiments," "further embodiment", "furthermore embodiment", "additional embodiment" or variants thereof do NOT necessarily refer to the same embodiments. Unless otherwise specified, one or more particular features and/or elements described in connection with one or more embodiments may be found in one embodiment, or may be found in more than one embodiment, or may be found in all embodiments, or may be found in no embodiments. Although one or more features and/or elements may be described herein in the context of only a single embodiment, or alternatively in the context of more than one embodiment, or further alternatively in the context of all embodiments, the features and/or elements may instead be provided separately or in any appropriate combination or not at all. Conversely, any features and/or elements described in the context of separate embodiments may alternatively be realized as existing together in the context of a single embodiment.

Any particular and all details set forth herein are used in the context of sonic embodiments and therefore should NOT be necessarily taken as limiting factors to the attached claims. The attached claims and their legal equivalents can be realized in the context of embodiments other than the ones used as illustrative examples in the description below.

According to one of the embodiments of the present disclosure, the caliper sensor assembly comprises sensors mounted on a ring, which itself is fastened to the vessel body. The caliper sensor comprises a dual-axis Hall-effect integrated circuit (IC) and a single diametrically magnetized magnet both placed co-axially on a mechanical arm. The dual-axis Hall effect IC is encapsulated in an epoxy compound to protect it from the pipeline environment. The diametric magnet is placed in a slot specially created on the sensor arm. The magnet is also encapsulated in an epoxy compound to protect it from the pipeline environment.

The dual axis-hall effect IC provides an analog output signal which is linearly proportional to the mechanical angle of a magnet with a resolution of 10 bits for each angle range. The magnet potted inside the sensor arm rotates with the caliper sensor arm when subjected to external deflection due to dents, protrusions, or bends. The biaxial sensor senses the changes in the magnetic field for the sensor arm rotation for varying deflection. The helical spring enables the arm to be bound to the pipe surface. The sensor assembly has been tested on a pre-designed track with dents and welds modeled on it. The assembly was fixed on the base with the retracting motion of the arm acting towards the plate. The profile on the plate consists of two arcs of radius 29 mm and 15 mm and three welds modeled in between. The sensor data has been recorded as it is moved along the track with the help of a rotor.

Embodiments of the present invention will be described below in detail with reference to the accompanying drawings.

Figure 1B:
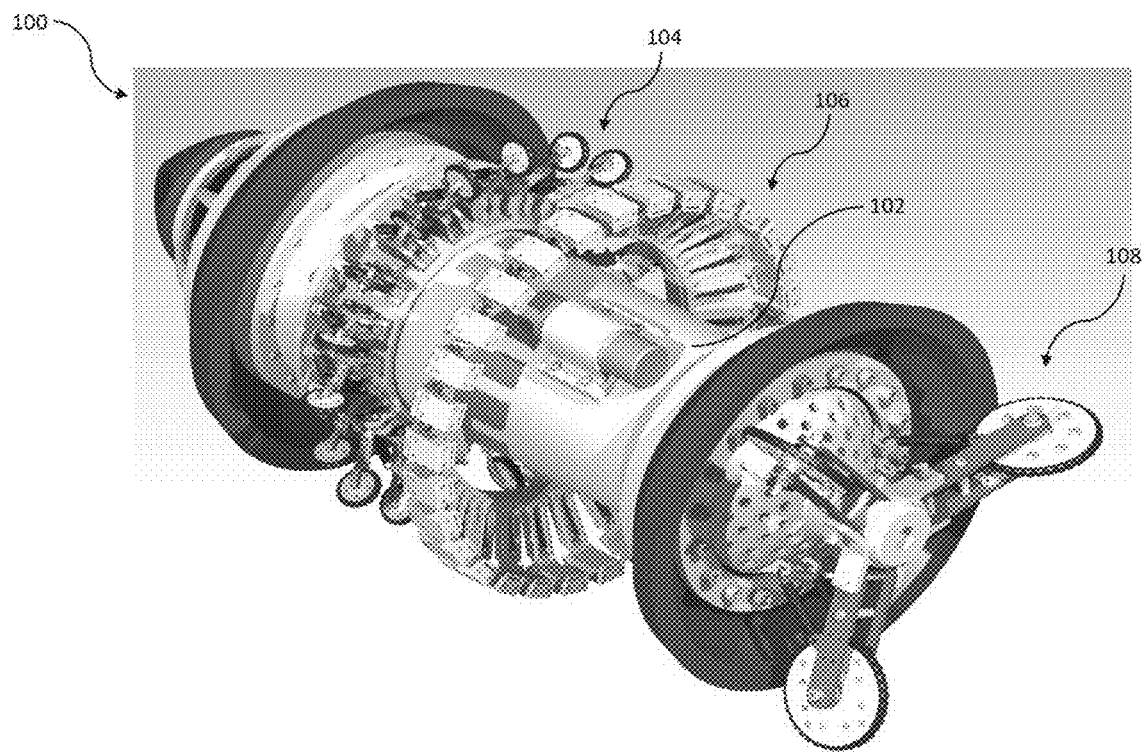
FIG. 1b illustrates an isometric view of the caliper pig for detecting geometrical deformation of the pipeline, according to an embodiment of the present disclosure.

FIG. 1a illustrates a planar view of a caliper pig 100 for detecting geometrical deformation of a pipeline, according to an embodiment of the present disclosure. FIG. 1b illustrates an isometric view of the caliper pig 100 for detecting geometrical deformation of the pipeline, according to an embodiment of the present disclosure. The caliper pig 100 may be employed in a pipeline and adapted to traverse within the pipeline to detect geometrical deformities associated with the pipeline. The geometrical deformities may include, but are not limited to, dents, ovalities, bend radius, and bend angle, without departing from the scope of the present disclosure.

Referring to FIG. 1a and 1b, in the illustrated embodiment, the caliper pig 100 may include, but is not limited to, a body 102, a first sensor arm assembly 104, a second sensor arm assembly 106, and an odometer assembly 108. Each of the first sensor arm assembly 104, the second sensor arm assembly 106, and the odometer assembly 108 may be adapted to be mounted on the body 102 of the caliper pig 100.

In an embodiment, the first sensor arm assembly 104 may be adapted to detect deformations in the pipeline. The second sensor arm assembly 106 may be adapted to detect the location of reference magnetic markers placed on the pipeline. Further, the odometer assembly 108 may be adapted to determine a distance travelled by the caliper pig within the pipeline. In an embodiment, the odometer assembly 108 may be coupled to the body 102. The odometer assembly 108 may be disposed at one end of the body 102. In an embodiment, the first sensor arm assembly 104 may interchangeably be referred to as the sensor arm assembly 104, without departing from the scope of the present disclosure. Constructional and operational details of the caliper pig 100 are explained in detail in the subsequent sections of the present di s closure.

Figure 2:
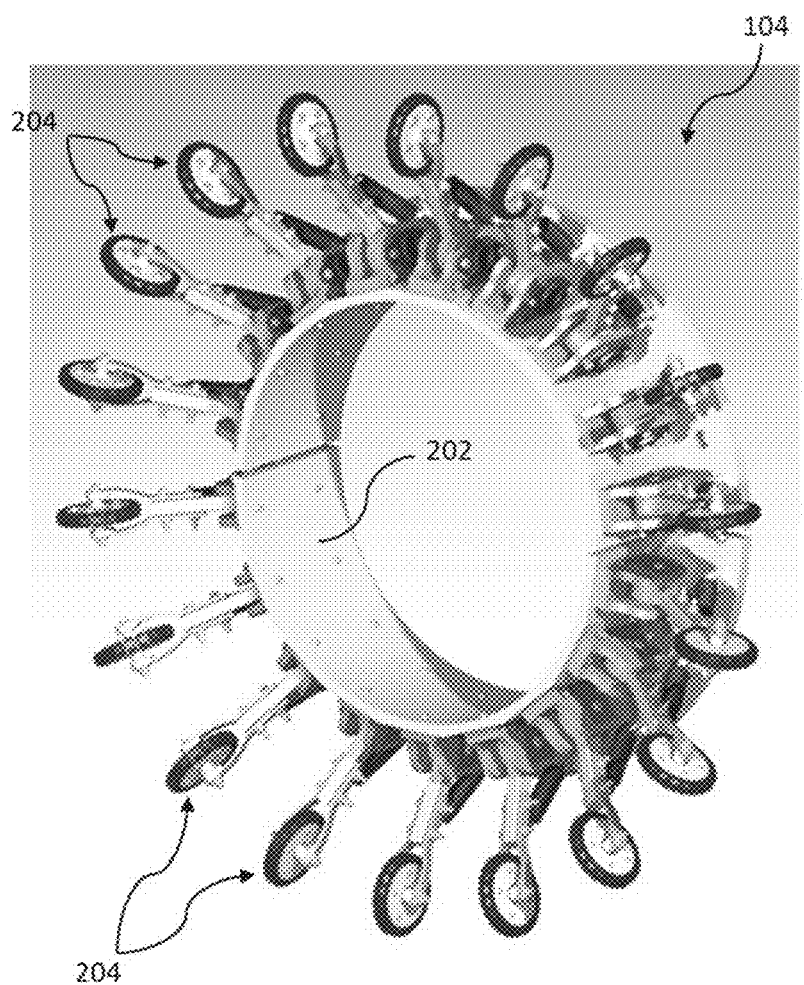
FIG. 2 illustrates an isometric view of a first sensor arm assembly of the caliper pig, according to an embodiment of the present disclosure.

FIG. 2 illustrates an isometric view of the first sensor arm assembly 104 of the caliper pig 100, according to an embodiment of the present disclosure. Referring to FIG. 1 and FIG. 2, in the illustrated embodiment, the first sensor arm assembly 104 may include, but is not limited to, a primary caliper sensor ring 202 and a plurality of sensor arms 204. The primary caliper sensor ring 202 may be adapted to be mounted on the body 102 of the caliper pig 100.

The plurality of sensor arms 204 may be adapted to be mounted on the primary caliper sensor ring 202. The plurality of sensor arms 204 may be circumferentially distributed on the primary caliper sensor ring 202. In an embodiment, the plurality of sensor arms 204 may interchangeably be referred to as the sensor arms 204, without departing from the scope of the present disclosure. Further, in an embodiment, the sensor arms 204 may individually be referred to as the sensor arm 204.

Figure 3A:
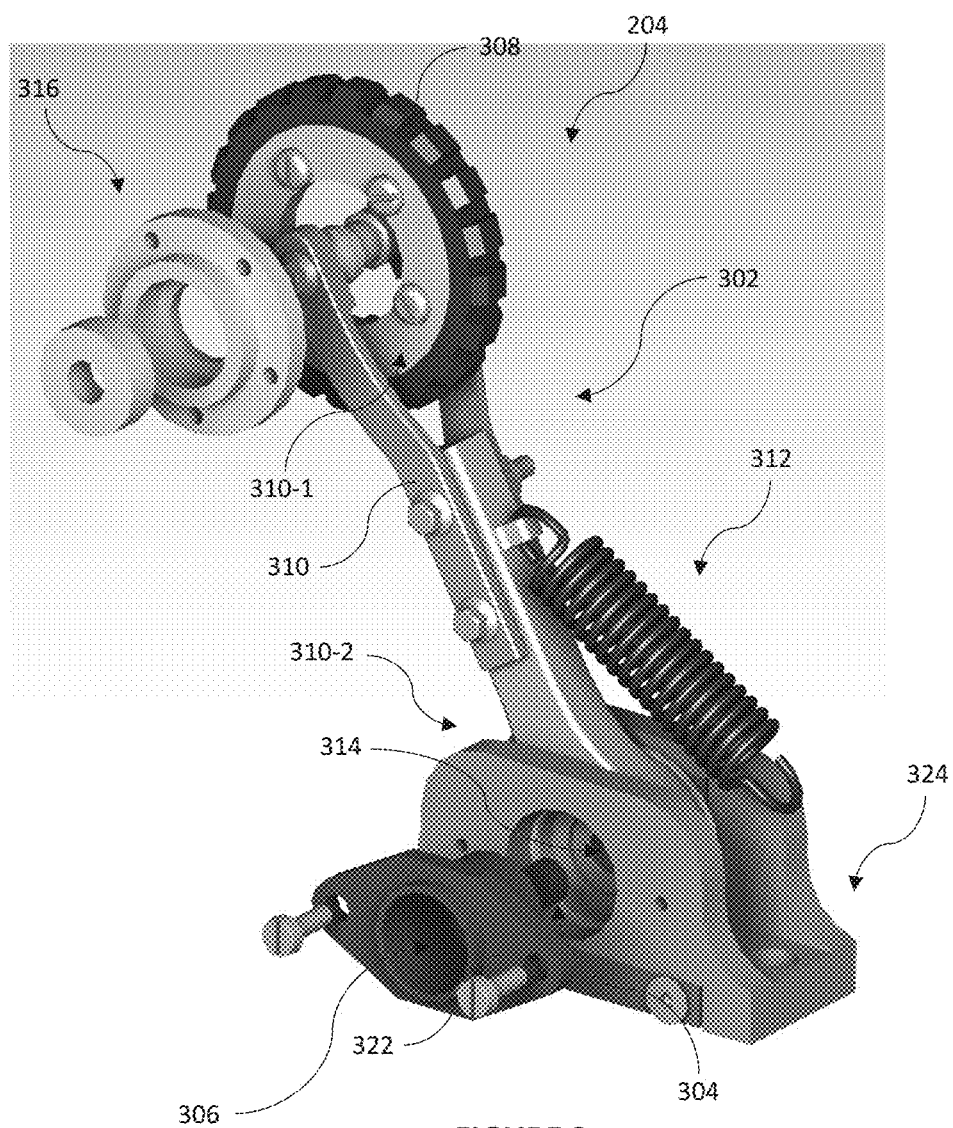
FIG. 3a illustrates an isometric view of a sensor arm from among a plurality of sensor arms of the first sensor arm assembly, according to an embodiment of the present disclosure.
Figure 3B:
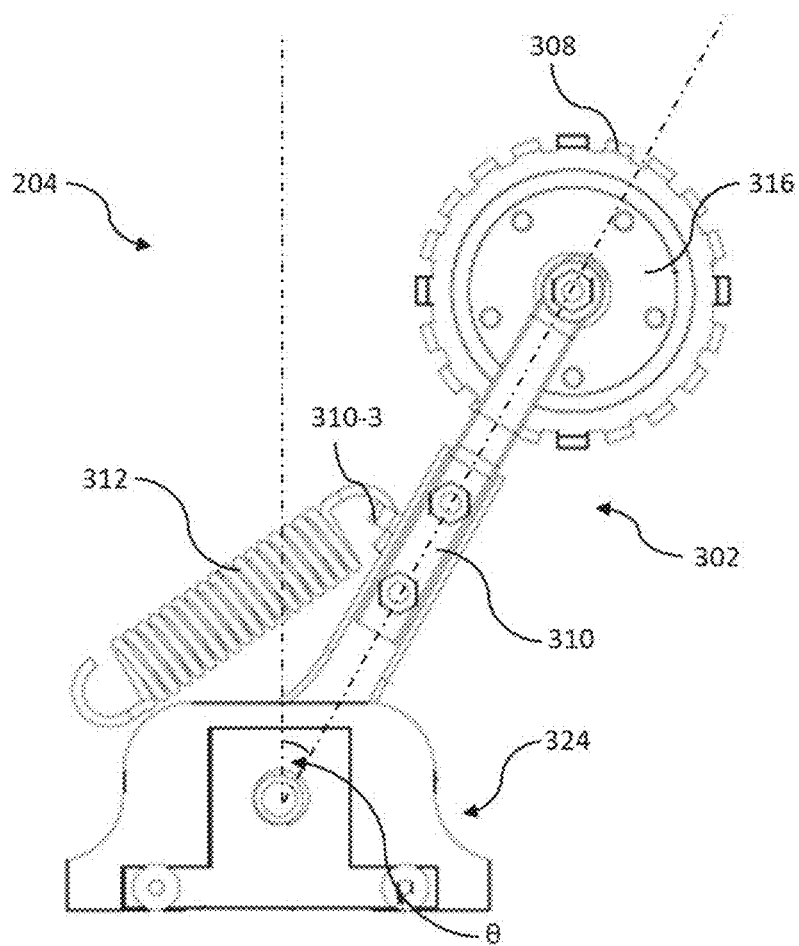
FIGS. 3b and 3c illustrate different views of the sensor arm of the first sensor arm assembly, according to an embodiment of the present disclosure.
Figure 3C:
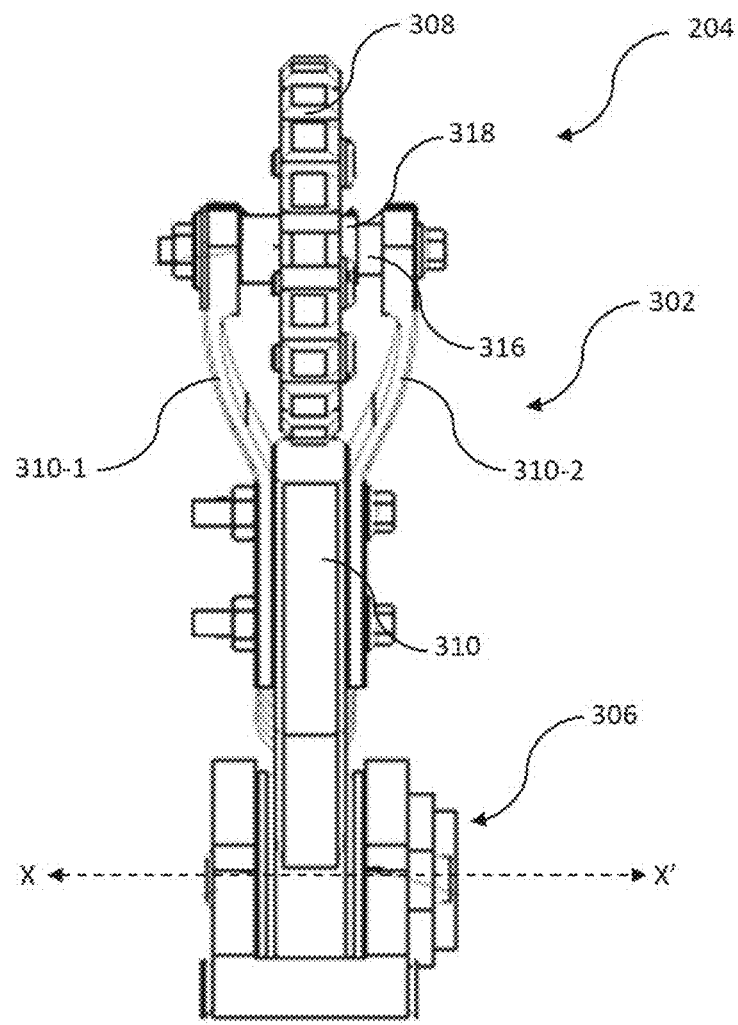

FIG. 3a illustrates an isometric view of a sensor arm from among the plurality of sensor arms 204 of the first sensor arm assembly 104, according to an embodiment of the present disclosure. FIGS. 3b and 3c illustrate different views of the sensor arm of the first sensor arm assembly 104, according to an embodiment of the present disclosure. Referring to FIGS. 3a, 3b, and 3c, each of the sensor arms 204 may include, but is not limited to, a sensing arm 302, a magnet 304, and a sensing unit 306. The sensing arm 302 may be adapted to be in contact with an internal surface of the pipeline. The sensing arm 302 may be adapted to resiliently move based on contour of the internal surface of the pipeline.

For the sake of simplicity and better understanding, constructional details of the sensor arms are explained with respect to only one sensor arm from among the plurality of sensor arms 204. As would be appreciated by the person skilled in the art, the description of the sensor arm 204 is equally applicable to other sensor aims of the first sensor arm assembly 104, without departing from the scope of the present disclosure.

Referring to FIG. 3a, FIG. 3b, and FIG. 3c, the sensing arm 302 may include, but is not limited to, a wheel 308, a connecting arm 310, and a resilient member 312. The wheel 308 may be adapted to be in contact with tie internal surface of the pipeline. The wheel 308 may be adapted to traverse on the internal surface of the pipeline when the caliper pig 100 moves within the pipeline. The sensor arm 204 may include, but is not limited to, a bearing housing 316 and a shaft 318 coupled to the wheel 308. The wheel 308 may be circumferentially disposed on the bearing housing 316. In an embodiment, the bearing housing 316 may be adapted to accommodate a bearing member 320, such as a ball bearing, adapted to be coupled to the shaft 318. The bearing housing 316 may be adapted to be fastened to the connecting arm 310 of the sensor arm 204.

In an embodiment, each of the plurality of sensor arms 204 may include, but is not limited to, a sensor housing 322 coupled to the sensing arm 302. The connecting arm 310 may be pivotally connected to the sensor housing 316 of the sensor arm 204. The connecting arm 310 may include a first end 310-1 coupled to the wheel 308 and the second end 310-2 connected to the sensor housing. In an embodiment, the connecting arm 310 may include a first arm extension 310-1 and a second arm extension 310-2 formed at the first end 310-1 of the connecting arm 310. The sensor arm 204 may include a mounting member 324 adapted to be coupled to the primary caliper sensor ring 202. Further, the mounting member 324 may be adapted to rotatably support the connecting arm 310. In the illustrated embodiment, the sensor housing 322 may be coupled to the mounting member 324.

Each of the first arm extension 310-1 and the second arm extension 310-2 may be adapted to be fastened to the bearing housing 316 to rotatably support the wheel 308 on the connecting arm 310. Further, the connecting arm 310 may include a pair of slots 314 adapted to coaxially accommodate the magnet 304. The magnet 304 may be adapted to be encapsulated in an epoxy material. In an embodiment, the magnet 304 may be embodied as a diametric magnet, without departing from the scope of the present disclosure.

Referring to FIGS. 3a, 3b, and 3c, in the illustrated embodiment, the resilient member 312 may be adapted to allow resilient movement of the connecting arm 310. One end of the resilient member 312 may be coupled to the connecting arm 310 and another end may be coupled to a mounting plate 110 (as shown in FIG. 1) disposed on the primary caliper sensor ring 202. In an embodiment, the connecting arm 310 may include an engaging member 310-3 adapted to be coupled to one end of the resilient member 312.

The sensor housing 322 may be adapted to accommodate the sensing unit 306. The magnet 304 may be coaxially disposed in the sensing arm 302 and adapted to rotate along the sensing arm 302. The sensing unit 306 may include, but is not limited to, a dual-axis Hall effect Integrated Circuit (IC), without departing from the scope of the present disclosure. The dual-axis Hall effect IC may be adapted to be positioned in the sensor housing 322 and encapsulated in an epoxy compound.

In an embodiment, the sensing unit 306 may be configured to detect a change in magnetic field associated with the magnet 304 based on the movement of the sensing arm 302. During the movement of the caliper pig 100 within the pipeline, the wheel coupled to the connecting arm 310 may traverse on the internal surface of the pipeline. When the wheel traverses over a deformed portion of the pipeline, the connecting arm 310 of the sensing arm 302 may resiliently move about an axis X-X' (as shown in FIG. 3c). Owing to the resilient movement of the connecting arm 310, the magnet 304 may also move along with the connecting arm 310. This results in variation in the magnetic field associated with the magnet 304. In an embodiment, the dual-axis Hall effect IC may be configured to detect the change in the magnetic field associated with the magnet 304.

Further, the sensing unit 306 may be configured to generate an output indicative of an angle of deflection θ of the sensing arm 302 while traversing on the internal surface of the pipeline. The output generated by the sensing unit 306 may be linearly proportional to an angle of deflection of the magnet 304. In an embodiment, the output may be embodied as a linear output voltage, without departing from the scope of the present disclosure. The change in the magnetic field may indicate a deformation of the pipeline.

Figure 4:
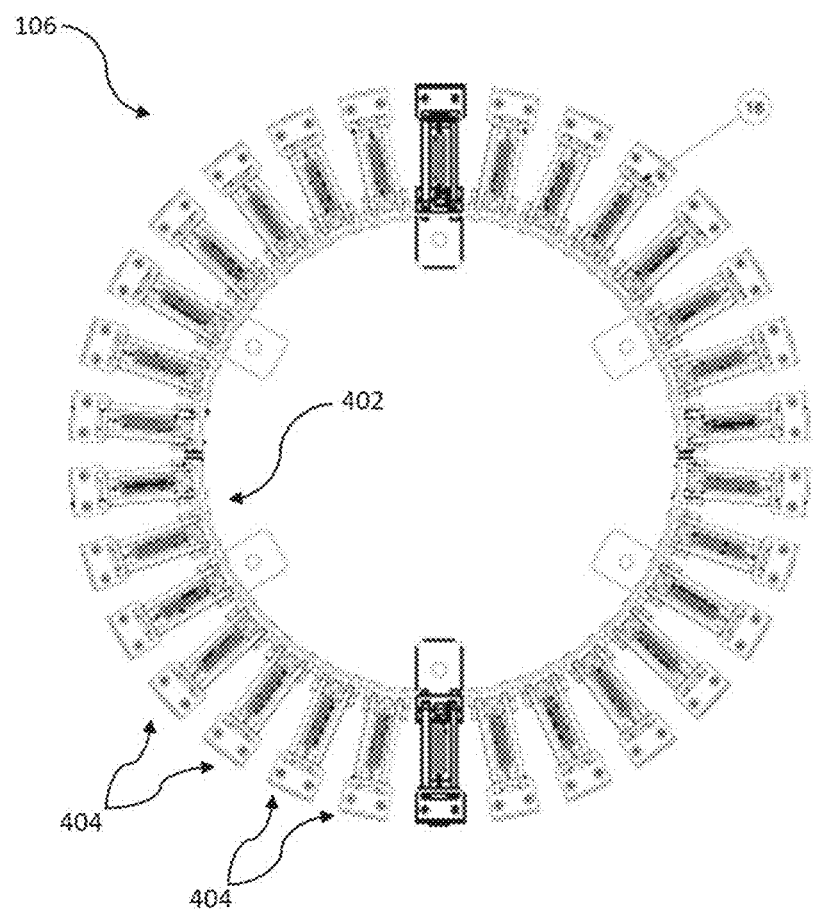
FIG. 4 illustrates a planar view of a second sensor arm assembly of the caliper pig, according to an embodiment of the present disclosure.

FIG. 4 illustrates a planar view of the second sensor arm assembly 106 of the caliper pig 100, according to an embodiment of the present disclosure. Referring to FIG. 4, the second sensor arm assembly 106 may include, but is not limited to, a secondary sensor ring 402 and a plurality of secondary sensor arms 404. In an embodiment, the plurality of secondary sensor arms 404 may interchangeably be referred to as the secondary sensor arms 404. Further, the secondary sensor arms 404 may individually be referred to as the secondary sensor arm 404.

Figure 5A:
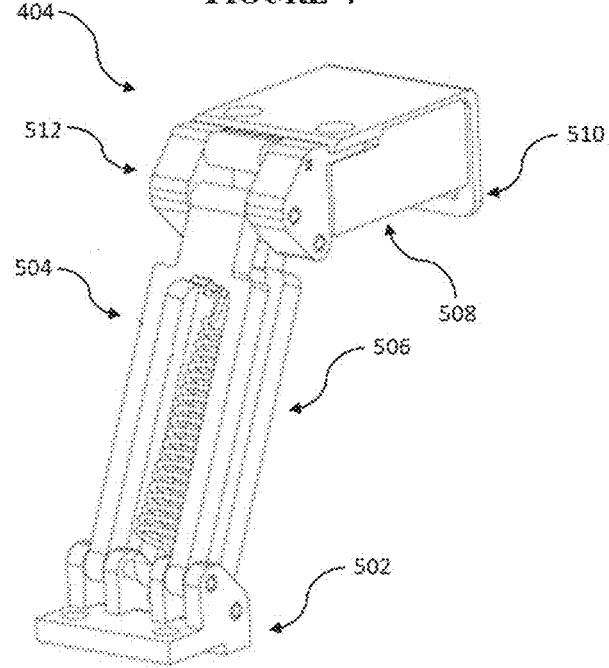
FIG. 5a illustrates an isometric view of a secondary sensor arm from among a plurality of secondary sensor arms of the second sensor arm assembly, according to an embodiment of the present disclosure.

The secondary sensor ring 402 may be adapted to be mounted on the body 102 of the caliper pig 100. The plurality of secondary sensor arms 404 may be adapted to be mounted and circumferentially distributed on the secondary sensor ring 402. In the illustrated embodiment, the second sensor arm assembly 106 may include a mounting bracket 502 (as shown in FIG. 5a), interchangeably referred to as the base member 502, adapted to be coupled to the secondary sensor ring 402. The mounting bracket 502 may be adapted to support the second sensor arm assembly 106 on the secondary sensor ring 402.

For the sake of simplicity and better understanding, constructional details of the secondary sensor arms are explained with respect to only one secondary sensor arm from among the plurality of secondary sensor arms 404. As would be appreciated by the person skilled in the art, the description of the secondary sensor arm 404 is equally applicable to other secondary sensor arms of the second sensor arm assembly 106, without departing from the scope of the present disclosure.

Figure 5B:
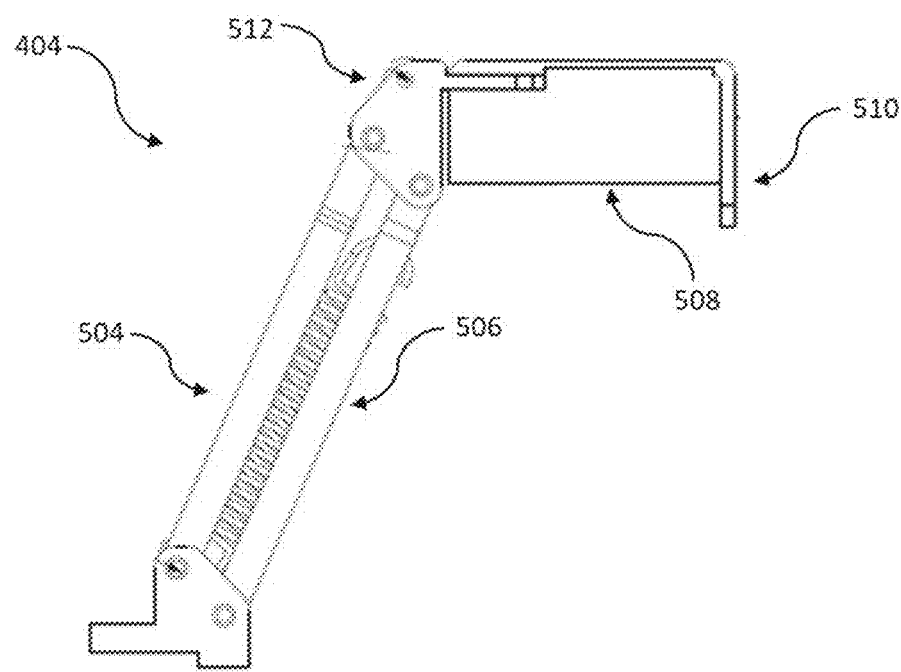
FIGS. 5b and 5c illustrate different views of the secondary sensor arm of the second sensor arm assembly, according to an embodiment of the present disclosure.

FIG. 5a illustrates an isometric view of the secondary sensor arm 404 from among the plurality of secondary sensor arms 404 of the second sensor arm assembly 106, according to an embodiment of the present disclosure. FIGS. 5b and 5e illustrate different views of the secondary sensor arm 404 of the second sensor arm assembly 106, according to an embodiment of the present disclosure.

Figure 5C:
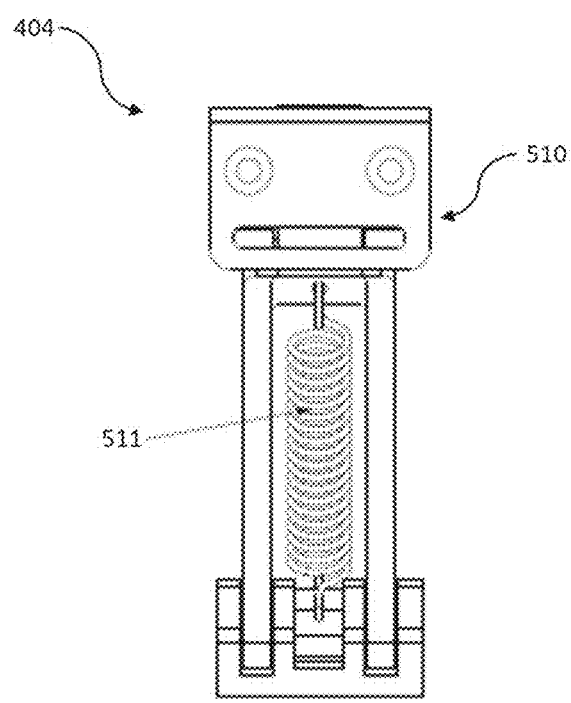

Referring to FIG. 5a, 5b, and 5c, each of the secondary sensor arms 404 may include, but is not limited to, the base member 502, a pair of top levers 504, a pair of bottom levers 506, a sensing module 508, and a wear plate 510. The pair of top levers 504 may be pivotally coupled to the base member 502. In the illustrated embodiment, the pair of top levers 504 may be parallel to the pair of top levers 504. The pair of bottom levers 506 may be disposed below the pair of top levers 504 and pivotally coupled to the base member 502. The secondary sensor arm 404 may include a resilient member 511, such as a helical spring, adapted to be connected to the pair of top levers 504 and the pair of bottom levers 506. One end of the resilient member 511 may be coupled to a bottom end of the pair of top levers 504 and, another end of the resilient member may be coupled to a top end of the pair of bottom levers 506.

Further, the wear plate 510 may be coupled to the sensing module 508 and adapted to be in contact with the inner surface of the pipeline. The sensing module 508 may be coupled to the pair of top levers 504 and the pair of bottom levers 506. In the illustrated embodiment, the second sensor arm assembly 106 may include a sensor mounting bracket 512 adapted to couple the sensing module 508 to the pair of top levers 504 and the pair of bottom levers 506. The sensing module 508 may be configured to detect a location of reference magnetic markers positioned on a surface of the pipeline. Each of the reference magnetic markers may indicate coordinates of a location within the pipeline.

During the movement of the caliper pig 100 within the pipeline, if the sensing unit 306 of the first sensor arm assembly 104 detects the change in the magnetic field indicating the deformation of a portion of the pipeline, then the location of such portion may be obtained from the sensing module 508 based on the location of the reference magnetic markers corresponding to such portion. The reference magnetic markers may be used as reference points to determine coordinates of a portion at which geometrical deformation is detected by the first sensor are. assembly 104.

Figure 6:
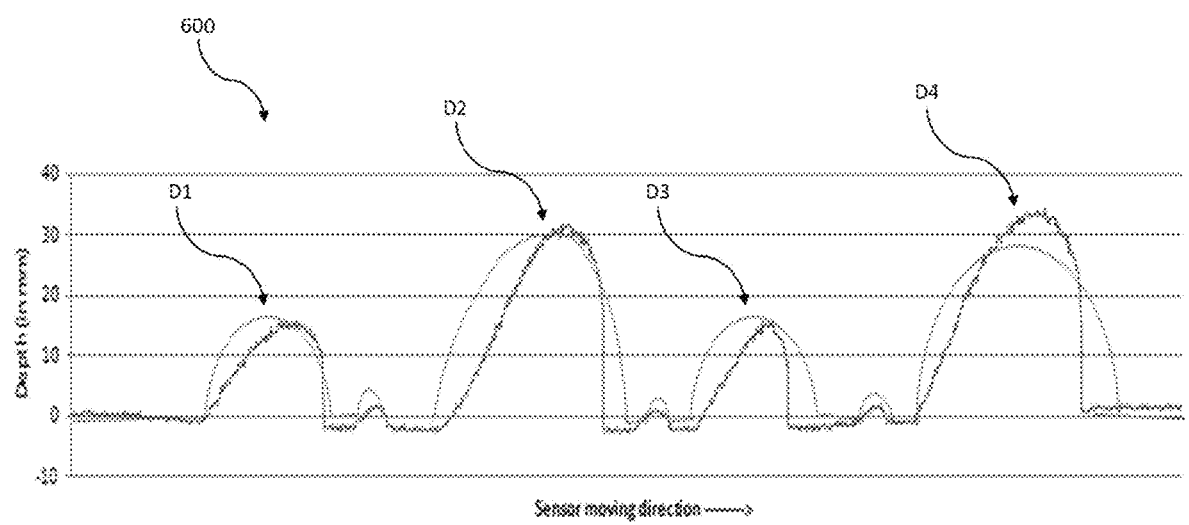
FIG. 6 illustrates an exemplary graph depicting depths of various dents detected in the pipeline by the caliper pig, according to an embodiment of the present disclosure.

FIG. 6 illustrates an exemplary graph 600 depicting depths of various dents in the pipeline detected by the caliper pig 100, according to an embodiment of the present disclosure. As shown in the graph, the first sensor arm assembly 104 of the caliper pig 100 has been able to capture the profile of the track with reasonable accuracy. The depths of dents D1 and D3 have been measured accurately as 15 mm. The depth of dent D3 is obtained slightly less than 15 mm which is compensated by the downward shift in the base plate by about 2 mm. Dent depths of the bigger arcs of radius 29 mm have also been obtained within reasonable deviation. The measured depth of dent D4 is more than 32 mm due to the upward shift of the base plate by about 2 to 3 mm.

The basic design of the caliper pig 100 is based on the measurement of the angle of deflection of the sensor arm assembly 104 which is in direct contact with the internal surface of the pipeline. The sensor arm assembly 104 is a high-resolution, low-power sensor system with a high-frequency response meeting the requirements of the speed of travel of the caliper pig 100 in the pipeline. In an implementation, the caliper pig 100 can be employed in applications for detecting deformation of the pipeline under operating conditions of pressures up to 150 kg/cm2 and high flow speed.

Owing to the above-explained constructional aspects of the sensor arm assembly 104, the magnitude of deflection caused by a geometrical deformation in the pipeline is substantially maximized. The sensor arm assembly 104 may be in direct contact with the internal surface of the pipeline. This results in substantially enhanced accuracy and detection capability of the sensor arm assembly 104. As explained earlier, the sensing unit 306 may generate a linear output voltage for a complete range of deflection of the sensor arm assembly 104 and thus, eliminating any inaccuracies due to non-linear output in conventional sensing units of the caliper pig. Further, as mentioned earlier, the sensor arm assembly 104 has high resolution and consumes low power and thus, making it suitable for use in the pipelines where only limited stored electrical energy is available. Therefore, the caliper pig 100 of the present disclosure is flexible in implementation, less complex, cost-effective, accurate, and convenient.

While specific language has been used to describe the present subject matter, any limitations arising on account thereto, are not intended. As would be apparent to a person in the art, various working modifications may be made to the method in order to implement the inventive concept as taught herein. The drawings and the foregoing description give examples of embodiments. Those skilled in the art will appreciate that one or more of the described elements may well be combined into a single functional element. Alternatively, certain elements may be split into multiple functional elements. Elements from one embodiment may be added to another embodiment.

We claim:

1. A caliper pig for detecting geometrical deformation of a pipeline, the caliper pig comprising:
   a body;
   a first sensor arm assembly comprising:
      a primary caliper sensor ring adapted to be mounted on the body;
      a plurality of sensor arms adapted to be mounted and circumferentially distributed on the primary caliper sensor ring, wherein each of the plurality of sensor arm comprising:
         a sensing arm adapted to be in contact with an internal surface of the pipeline, wherein the sensing arm is adapted to resiliently move based on contour of the internal surface of the pipeline;
         a magnet coaxially disposed in the sensing arm and adapted to rotate along the sensing arm; and
         a sensing unit configured to:
            detect a change in magnetic field associated with the magnet based on the movement of the sensing arm; and
            generate an output indicative of an angle of deflection of the sensing arm while traversing on the internal surface of the pipeline; and
   a second sensor arm assembly comprising:
      a secondary sensor ring adapted to be mounted on the body of the caliper pig;
      a plurality of secondary sensor arms adapted to be mounted and circumferentially distributed on the secondary sensor ring, wherein each of the secondary sensor arms comprising:
         a base member;
         a pair of top levers pivotally coupled to the base member;
         a pair of bottom levers disposed below the pair of top levers and pivotally coupled to the base member;
         a sensing module coupled to the pair of top levers and the pair of bottom levers; and
         a wear plate coupled to the sensing module and adapted to be in contact with the inner surface of the pipeline.

2. The caliper pig as claimed in claim 1, wherein each of the plurality of sensor arm comprises a sensor housing coupled to the sensing arm and adapted to accommodate the sensing unit.

3. The caliper pig as claimed in claim 2, wherein the sensing arm comprises:
   a wheel adapted to be in contact with the internal surface of the pipeline, wherein the wheel is adapted to traverse on the internal surface of the pipeline when the caliper pig moves within the pipeline;

a connecting arm pivotally connected to the sensor housing, wherein the connecting arm includes a first end coupled to the wheel and the second end connected to the sensor housing; and a resilient member adapted to allow resilient movement of the connecting arm, wherein one end of the resilient member is coupled to the connecting arm and another end is coupled to the mounting plate.

4. The caliper pig as claimed in claim 1, wherein the sensing unit comprises a dual-axis Hall effect Integrated Circuit (IC).

5. The caliper pig as claimed in claim 4, wherein the dual-axis Hall effect IC is adapted to positioned in a sensor housing and encapsulated in an epoxy compound.

6. The caliper pig as claimed in claim 3, wherein the connecting arm include a pair of slots adapted to coaxially accommodate the magnet, the magnet is adapted to be encapsulated in an epoxy material.

7. The caliper pig as claimed in claim 1, wherein the magnet is embodied as a diametric magnet.

8. The caliper pig as claimed in claim 1, wherein the output generated by the sensing unit is linearly proportional to an angle of deflection of the magnet.

9. The caliper pig as claimed in claim 1 further comprising an odometer assembly coupled to the body and disposed at one end of the body, wherein the odometer assembly is configured to determine a distance travelled by the caliper pig within the pipeline.

10. The caliper pig as claimed in claim 1, wherein the change in magnetic field indicates a deformation of the pipeline.

\* \* \* \* \*